United States Patent
Hirashima

(10) Patent No.: US 6,740,969 B1
(45) Date of Patent: *May 25, 2004

(54) ELECTRONIC DEVICE

(75) Inventor: Toshinori Hirashima, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 573 days.

This patent is subject to a terminal disclaimer.

(21) Appl. No.: 09/646,046

(22) PCT Filed: Jun. 29, 2000

(86) PCT No.: PCT/JP00/04319

§ 371 (c)(1),
(2), (4) Date: Sep. 13, 2000

(87) PCT Pub. No.: WO01/15230

PCT Pub. Date: Mar. 1, 2001

(30) Foreign Application Priority Data

Aug. 25, 1999 (JP) ............ 11-238938

(51) Int. Cl.[7] ............... H01L 23/495
(52) U.S. Cl. .......... 257/723; 257/401; 257/671; 257/673; 257/693; 257/696
(58) Field of Search ............. 361/288, 341, 361/342, 343, 401, 666, 673, 676, 690–693, 696, 780, 783, 785, 924; 257/668, 671, 723, 737

(56) References Cited

U.S. PATENT DOCUMENTS

| | | | | |
|---|---|---|---|---|
| 5,105,536 A | * | 4/1992 | Neugebauer et al. | 29/832 |
| 5,311,404 A | * | 5/1994 | Trask et al. | 361/762 |
| 6,178,093 B1 | * | 1/2001 | Bhatt et al. | 361/795 |
| 6,256,200 B1 | * | 7/2001 | Lam et al. | 361/704 |
| 6,423,623 B1 | * | 7/2002 | Bencuya et al. | 438/612 |
| 6,479,888 B1 | * | 11/2002 | Hirashima et al. | 257/673 |
| 6,515,371 B2 | * | 2/2003 | Akiyama et al. | 257/778 |
| 6,569,764 B1 | * | 5/2003 | Hirashima et al. | 438/673 |

FOREIGN PATENT DOCUMENTS

| | | |
|---|---|---|
| JP | 48-9675 | 2/1973 |
| JP | 51-7015 | 2/1976 |
| JP | 3-38845 | 2/1991 |
| JP | 8-64634 | 3/1996 |
| JP | 9-36186 | 2/1997 |

OTHER PUBLICATIONS

Tanaka, "Charge and Discharge Control IC HD62MD150 Series for Litium–Ion Rechargeable Battery—Design Guide for Battery Pack Engineers" (Hitachi Microcomputer Technical Bulletin, vol. 11, No. 2, pp. 33–35 1998).

Yoneda et al., "TPCS8004 2.5 V–Driven n–Channel, Third–Generation Trench–Gate MOSFET" (Toshiba Review, vol. 53, No. 11 (1998) pp. 45–47).

* cited by examiner

Primary Examiner—John B. Vigushin
(74) Attorney, Agent, or Firm—Reed Smith, LLP; Stanley P. Fisher, Esq.; Juan Carlos A. Marquez, Esq.

(57) ABSTRACT

An electronic device having a first semiconductor device for powering MOSFET and a second semiconductor device for controlling on a principal surface and sealed by a resin body. The first semiconductor device has a semiconductor chip with a first and a second electrodes formed on a first principal surface and also with a third electrode formed on a second principal surface, and an insulative or dielectric sheet laid out between a first lead and the first principal surface of the semiconductor chip and between a second lead and the semiconductor ship for covering a specified area of the first principal surface of the semiconductor chip other than a region in which a plurality of projected electrodes are disposed. An upper surface of the first and second leads of the first semiconductor device is positioned under an upper surface of the resin body of the second semiconductor device in a thickness direction of a wiring substrate.

11 Claims, 13 Drawing Sheets

ELECTRONIC DEVICE

TECHNICAL FIELD

The present invention relates in general to electronic devices and, in more particular, to techniques effectively applicable to electronic devices having power transistors.

BACKGROUND OF THE INVENTION

Electronic devices include a power module for control of overcharging or overdischarging of a lithium (Li) ion secondary battery unit as built in small size electronic equipment such as portable telephone handsets, handheld information processing terminal equipment, and mobile personal computers or the like. This power module is accommodated within a case housing along with more than one Li-ion secondary battery.

The power module is typically designed so that chosen parts or components are mounted on a wiring substrate, which include power transistors, a semiconductor device for use as a controller, resistive elements, capacitive elements and others.

The power transistors widely employable therein may include power transistors with a plastic package structure of the surface mount type, generally called the TSSOP (Thin Shrink Small Out-line Package) type, for example.

A currently available power transistor of the TSSOP type is mainly constituted from a semiconductor chip having an element formation surface and a back surface on each of which electrodes are formed, a support body for supporting the back surface of the semiconductor chip, a resin sealing body for sealing the semiconductor chip, and a plurality of electrical leads. A respective one of the plurality of leads is designed to extend inwardly and outwardly of the resin seal body and have an internal lead portion (also referred to as inner lead) that is positioned inside of the resin seal body and an external lead portion (also called outer leads) placed outside of the resin seal body. Respective external lead portions of the plurality of leads are machined so that these are bent and fold into a gull wing-like shape, which is one of known surface-mount lead shapes. The plurality of leads include more than one lead having its internal lead portion that is electrically connected via a conductive wire to an electrode on the element formation surface of the semiconductor chip while letting internal lead portions of the remaining leads be electrically connected via the support body to those electrodes on the back surface of the semiconductor chip.

Note here that the power module per se has been disclosed, for example, in Hitachi Microcomputer Technical Bulletin, Vol. 11, No. 2 at pp. 33–35.

Also note that one typical power transistor of the TSSOP type is recited for example in "2.5-V Driven Trench Gate MOSFET of Third Generation," Toshiba Review, Vol. 53, No. 11 (1998) at pp. 45–47.

The inventors as named herein have analyzed the above-stated power module to find out problems which follow.

With miniaturization or "downsizing" of small size electronic equipment, power modules as built in the small size electronic equipment have decreased in dimension accordingly. As the quest for downsizing of such small size electronic equipment is expected to grow endlessly in near future, a need is felt to further downsize the power modules. To achieve such downsizing of the power module, it should be required to reduce or shrink the area of a wiring substrate used. Area shrinkage of the wiring substrate would result in a decrease in contact area between the wiring substrate and its outside air, which in turn makes it difficult for the heat transmitted from power transistors to the wiring substrate to escape outwardly thus causing the power module to decrease in heat releasability. If the power transistors are designed to increase in heat releasability then it becomes possible to compensate for any possible decreases in heat releasability of such power modules which can occur due to shrinkage of the wiring substrate area. Unfortunately, in those package structures that are inherently designed to employ a resin seal body for sealing a semiconductor chip and internal lead portions of leads associated therewith, such as the TSSOP type one, it is impossible to successfully compensate for the heat releasability of power transistors otherwise occurring due to shrinkage in area of the wiring substrate because of the fact that the semiconductor chip and the internal lead portions of the leads are entirely covered with resin materials that are less in heat conductivity. This in turn makes it difficult to further downsize the power module.

It is therefore an object of the present invention to provide a technique for enabling miniaturization or downsizing of an electronic device.

This and other objects and new features of the present invention will become apparent from the following more particular description of preferred embodiments of the invention, as illustrated in the accompanying drawings.

DISCLOSURE OF THE INVENTION

A representative one of the inventive concepts as disclosed and claimed herein will be explained in brief below.

An electronic device comprises a wiring substrate having on its principal surface a plurality of electrodes along with a first semiconductor device and a second semiconductor device which are built on the principal surface of the wiring substrate, which device is featured in that said first semiconductor device includes:
a semiconductor chip having a first principal surface and a second principal surface that oppose each other, first and second electrodes as formed on said first principal surface, and a third electrode formed on said second principal surface;
a first lead having a first portion placed over said first electrode and a second portion as integrally formed with said first portion and positioned outside of said semiconductor chip;
a second lead having a first portion placed over aid second electrode and a second portion as integrally formed with said first portion and positioned outside of said semiconductor chip;
a plurality of projected electrodes as disposed between said first lead and said first electrode and between said second lead and said second electrode for electrically connecting between respective ones of them; and
an insulative sheet disposed between said first lead and the first principal surface of said semiconductor chip and between said second lead and said semiconductor chip, which sheet covers a selected area of the first principal surface of said semiconductor chip other than a region in which said plurality of projected electrodes are disposed, wherein
the second portion of each of said first lead and said second leads is bent so that its distal end is disposed at substantially the same height as that of the second principal surface of said semiconductor chip in a direction along the thickness of said semiconductor chip, and a respective one of the distal end of the second portion of each of said first lead and second lead and said third electrode is connected to its corresponding one of electrodes of said wiring substrate.

BEST MODE FOR CARRYING OUT THE INVENTION

Figure 1:
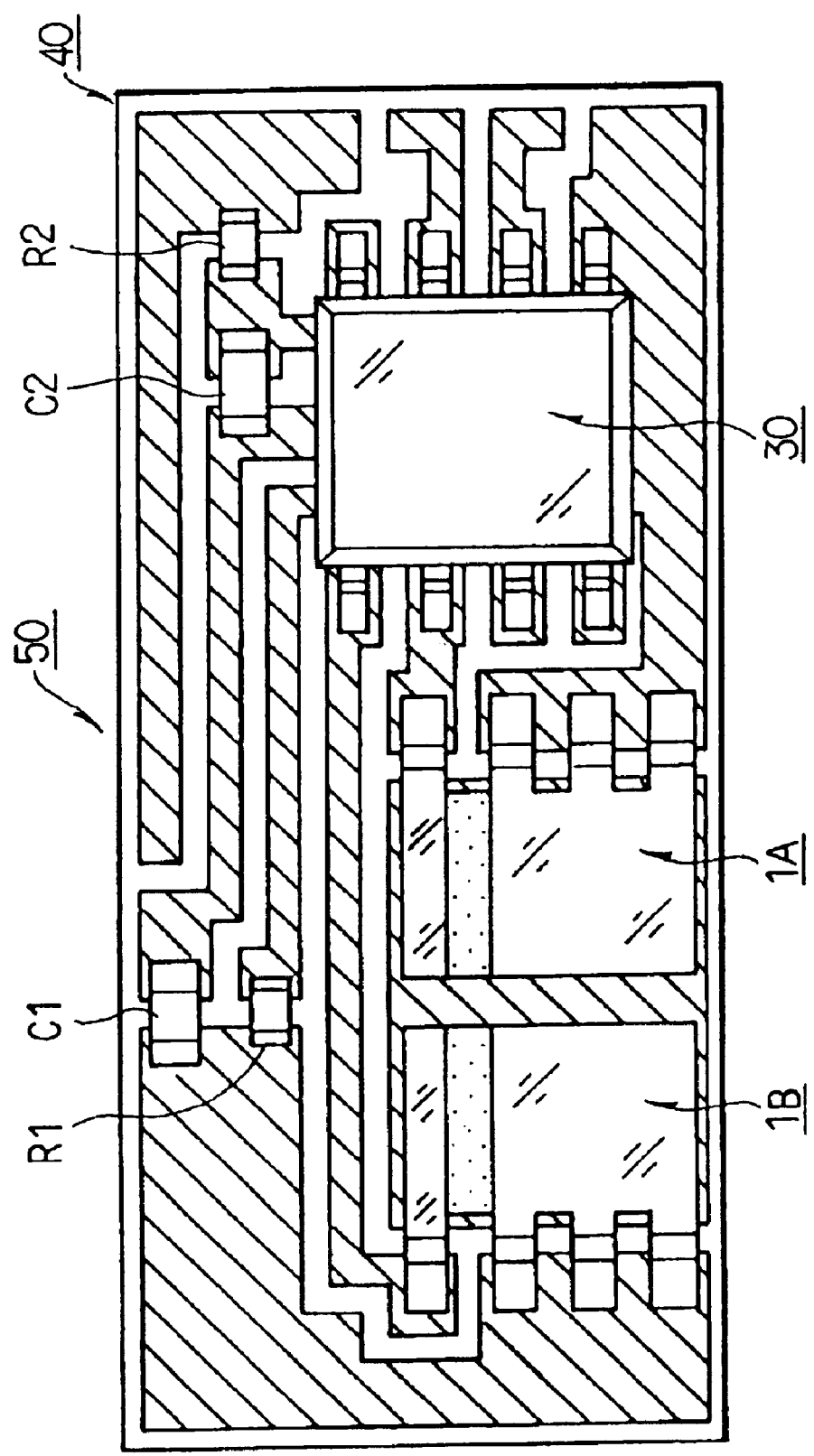
FIG. 1 is a diagram pictorially showing a schematical plan view of an overall structure of a power module in accordance with one preferred embodiment of the present invention.

An arrangement of the present invention will now be explained in conjunction with an embodiment permitting the invention to be applied to a power module for use in controlling overcharging or overdischarging of a Li-ion secondary battery unit. It should be noted that in the following drawings for explanation of such embodiment, those having the same functions will be designated by the same reference characters, and any repetitive explanation thereof will be eliminated.

FIG. 1 is a diagram pictorially showing a schematical plan view of a structure of a power module (electronic device) in accordance with one preferred embodiment of the present invention.

Figure 2:
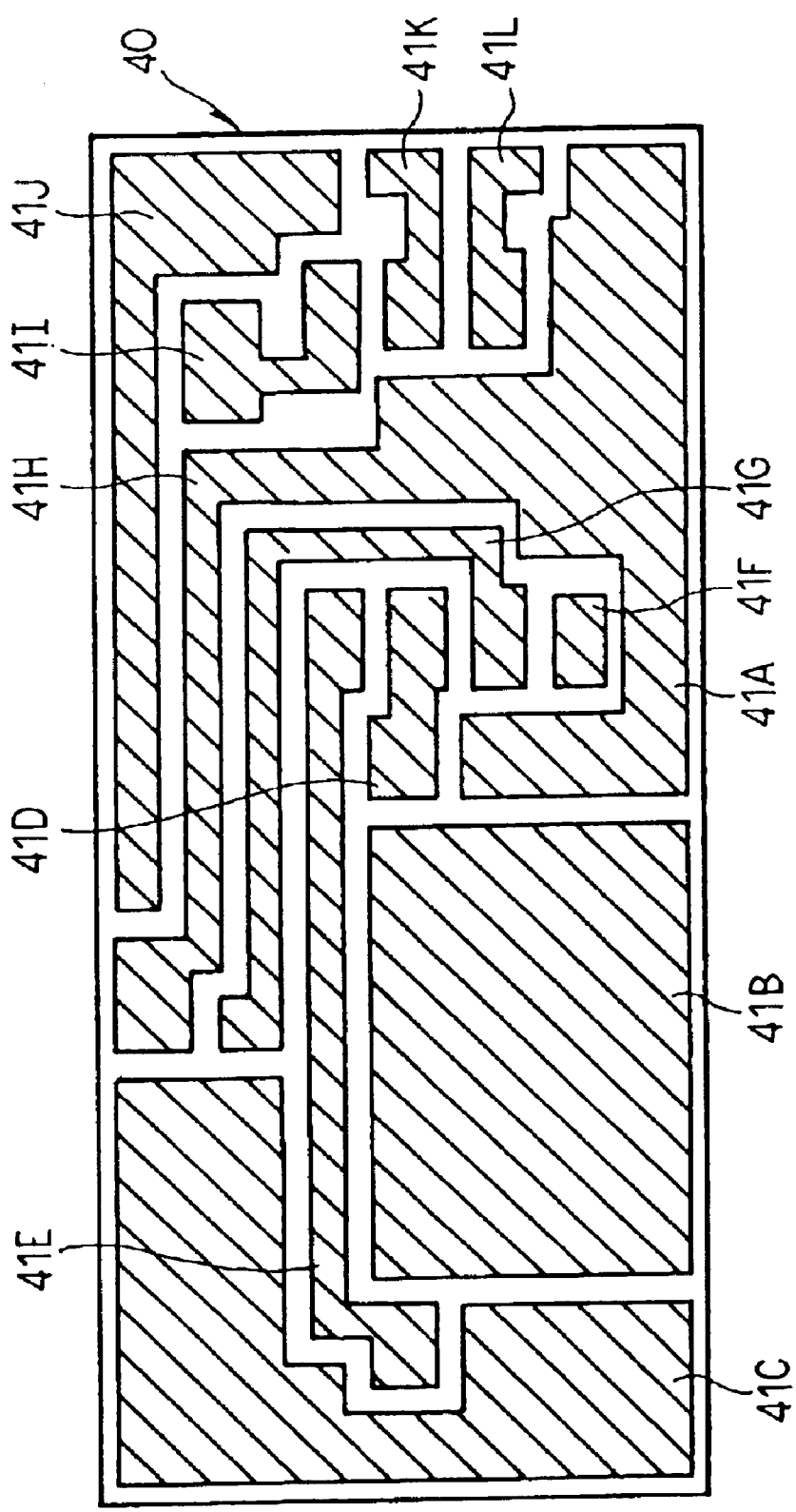
FIG. 2 is a diagram pictorially depicting a schematical plan view of a lead pattern of a wiring substrate of FIG. 1.

FIG. 2 is a diagram pictorially depicting a schematical plan view of a lead pattern of a wiring substrate of FIG. 1.

Figure 3:
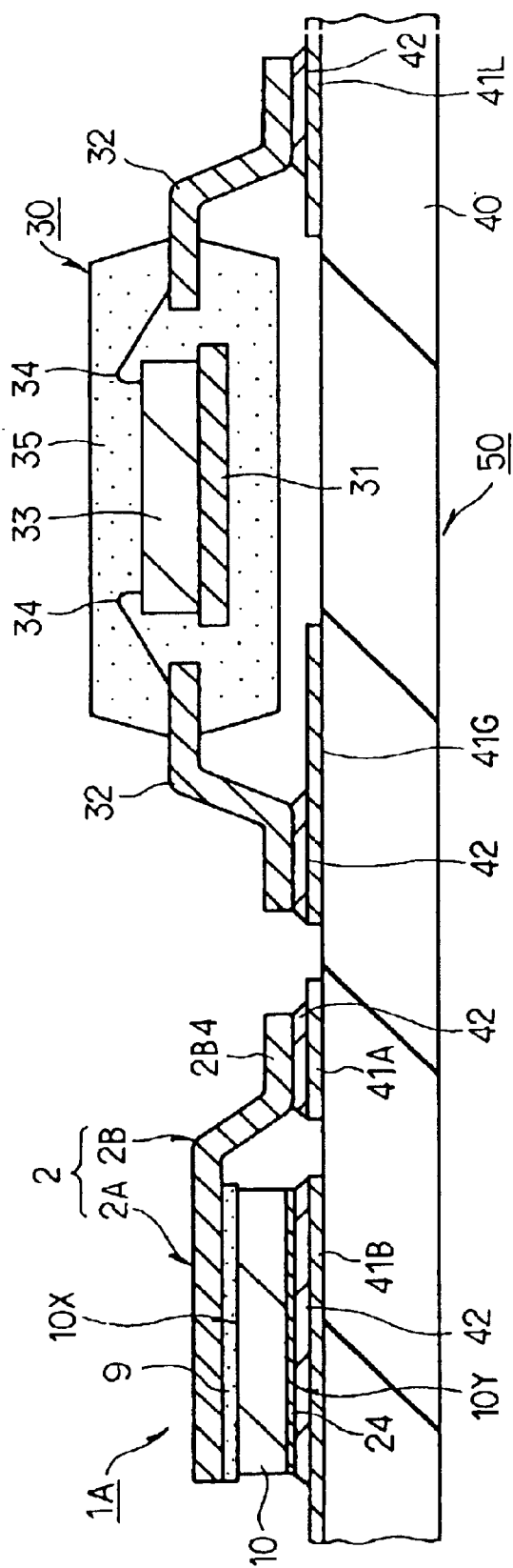
FIG. 3 is a diagram schematically showing in cross-section main part of the structure of FIG. 1.

FIG. 3 is a diagram schematically showing in cross-section main part of the structure of FIG. 1.

Figure 4:
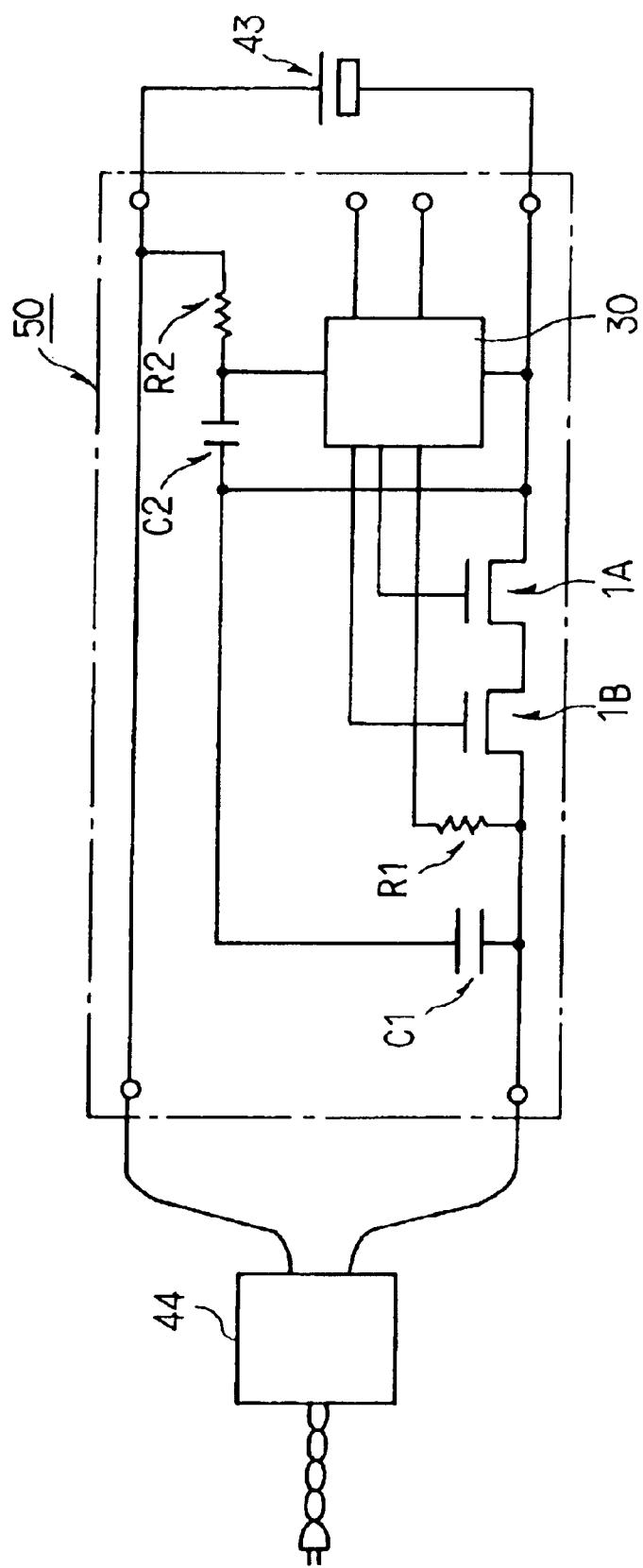
FIG. 4 is a diagram showing equivalent circuitry of a circuit configuration of the power module of FIG. 1.

FIG. 4 is a diagram showing equivalent circuitry of a circuit configuration of the power module of FIG. 1.

Figure 5:
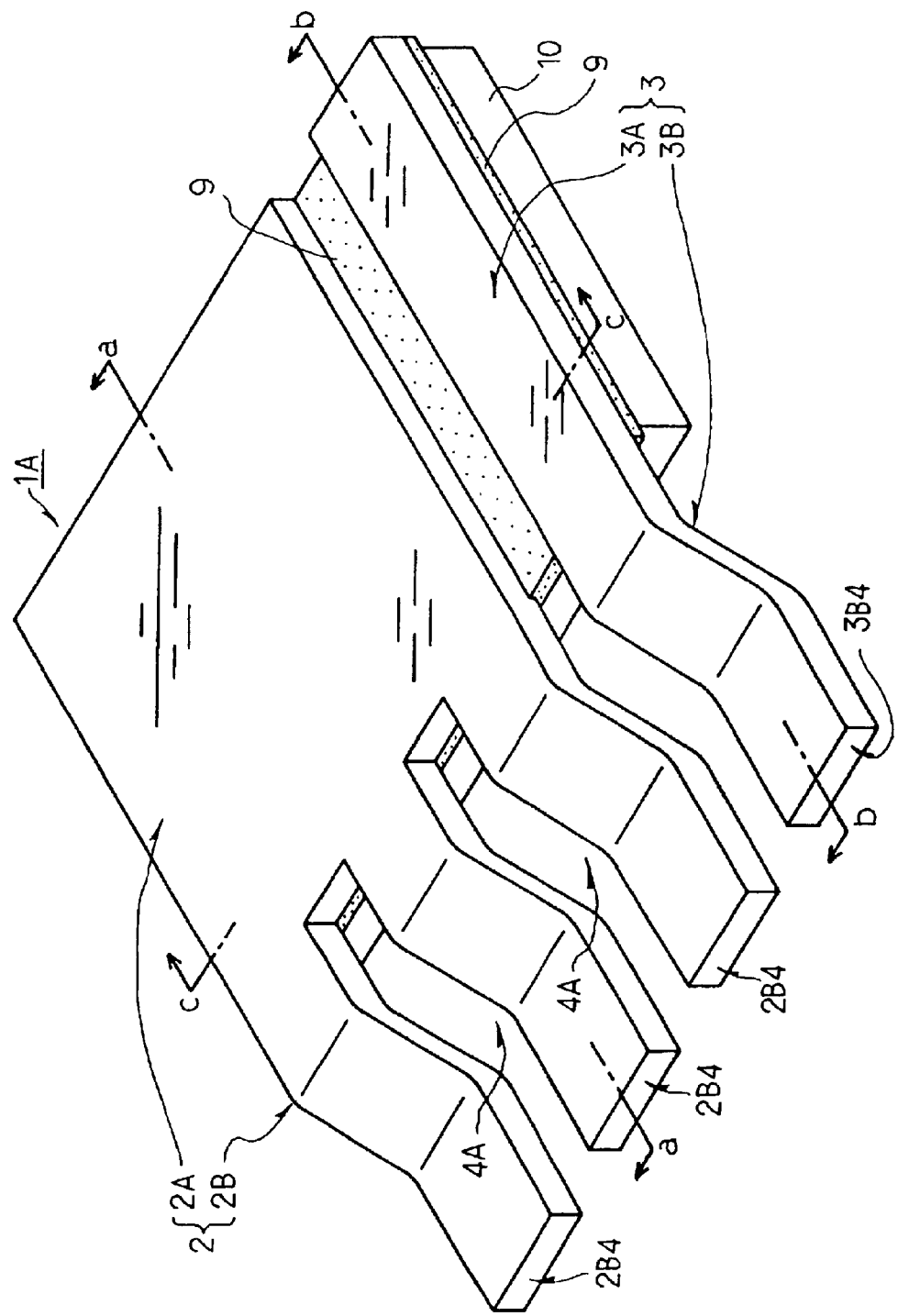
FIG. 5 is a diagram pictorially and schematically showing a perspective view of a structure of a power transistor of FIG. 1.

FIG. 5 is a diagram pictorially and schematically showing a perspective view of a structure of a power transistor of FIG. 1.

Figure 6:
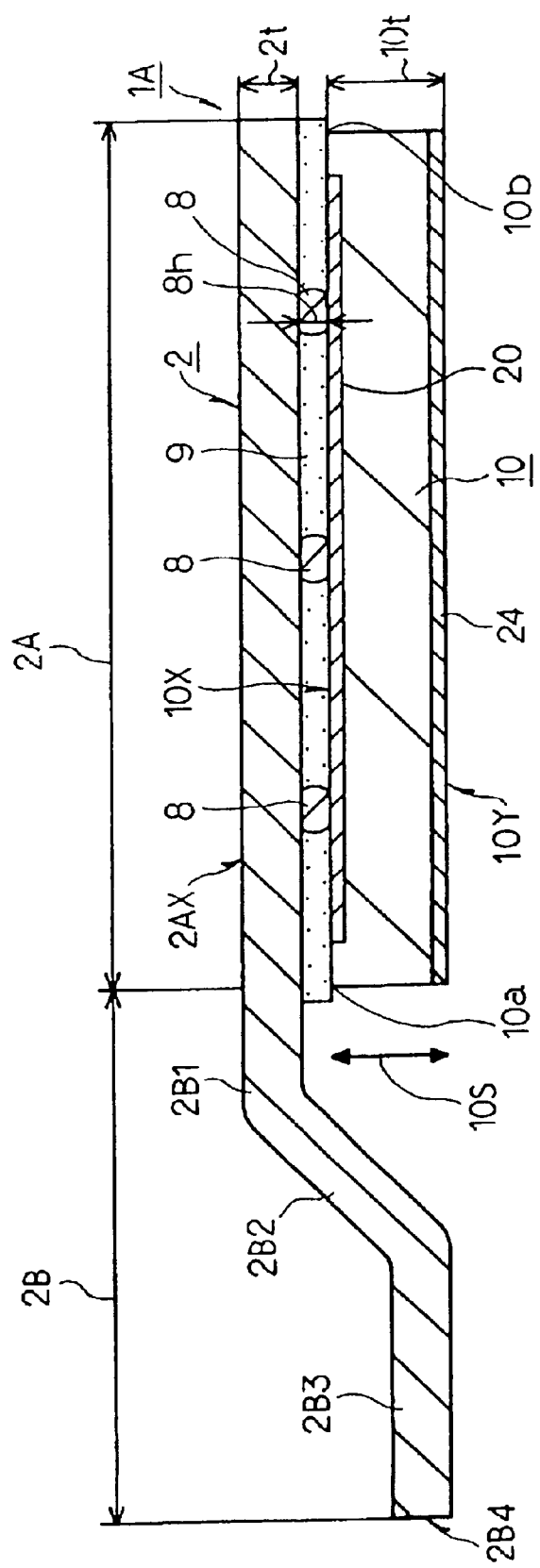
FIG. 6 is a pictorial representation of a sectional view of the structure of FIG. 5 as taken along line a—a.

FIG. 6 is a pictorial representation of a sectional view of the structure of FIG. 5 as taken long line a—a.

Figure 7:
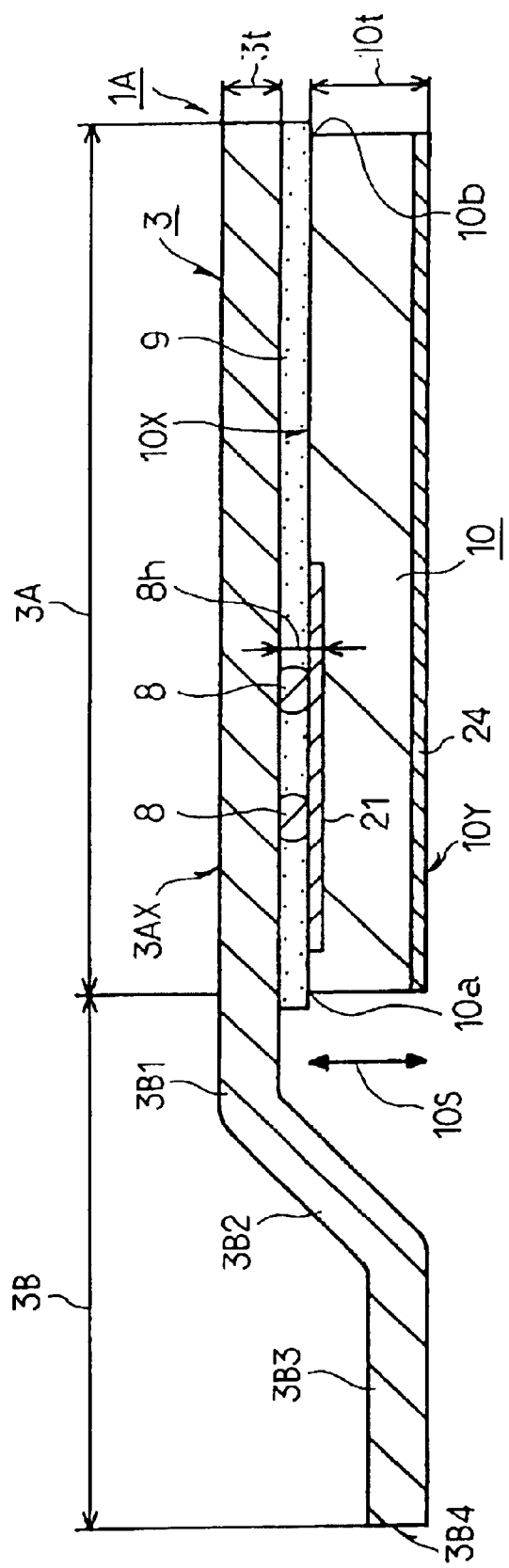
FIG. 7 is a pictorial representation of a sectional view of the structure of FIG. 5 taken along line b—b.

FIG. 7 is a pictorial representation of a sectional view of the structure of FIG. 5 taken along line b—b.

Figure 8:
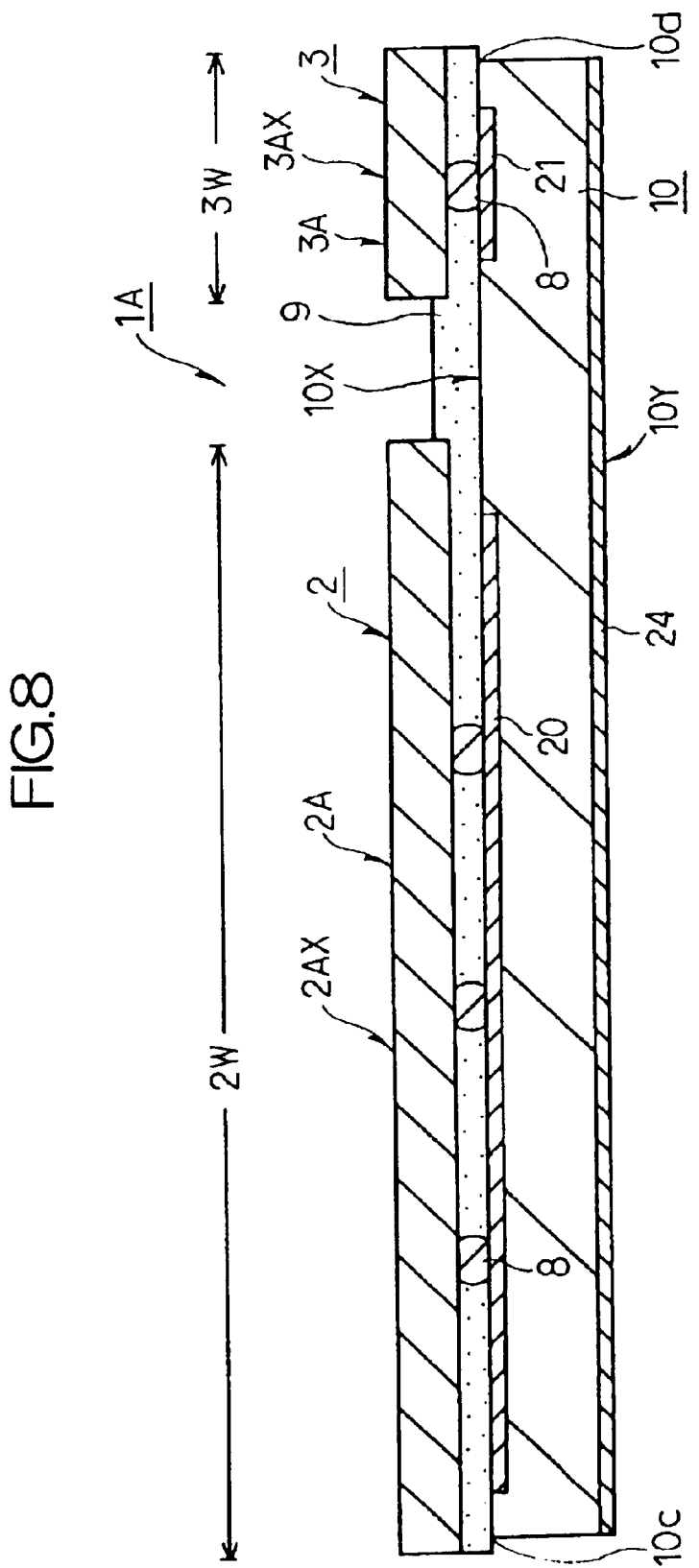
FIG. 8 is a pictorial representation of a sectional view of the structure of FIG. 5 along line c—c.

FIG. 8 is a pictorial representation of a sectional view of the structure of FIG. 5 along line c—c.

Figure 9:
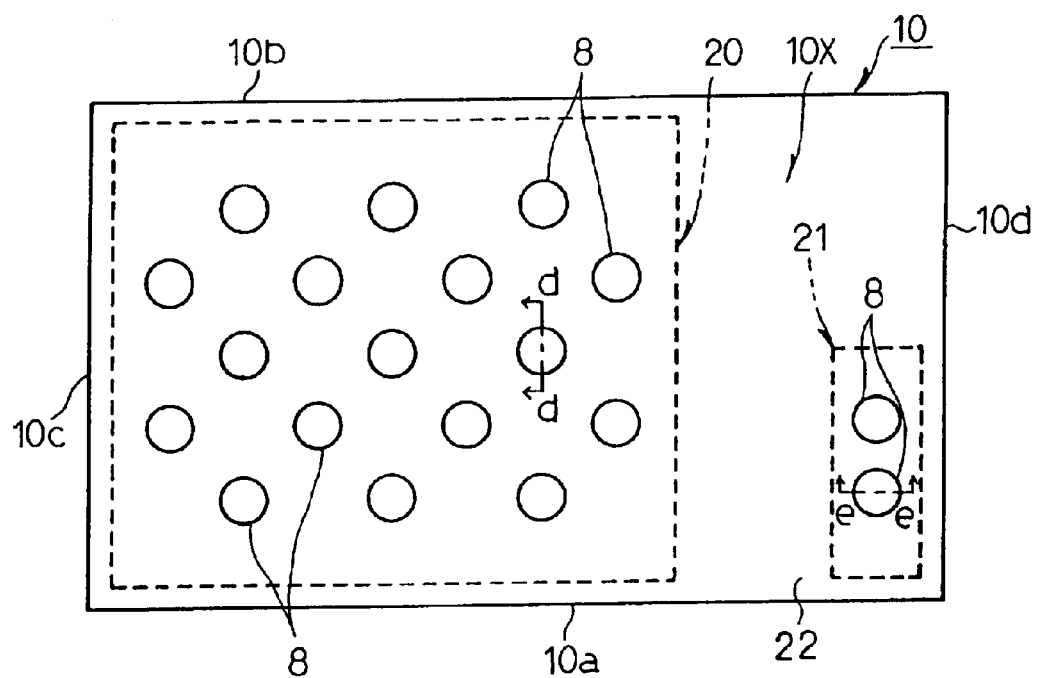
FIG. 9 is a diagram pictorially and schematically showing a top plan view of a structure of a semiconductor chip of FIG. 5.

FIG. 9 is a diagram pictorially and schematically showing a top plan view of a structure of a semiconductor chip of FIG. 5.

Figure 10:
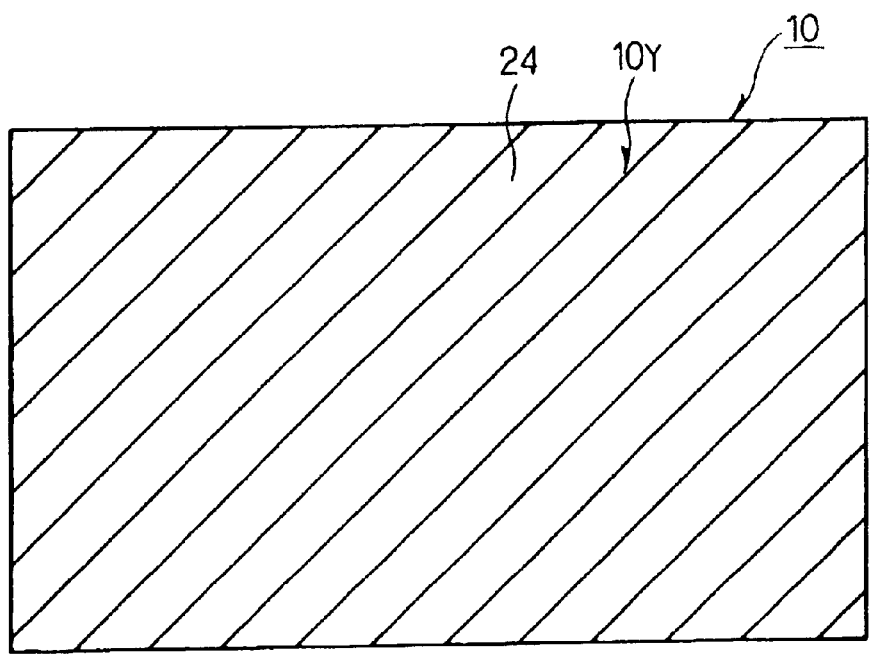
FIG. 10 is a diagram pictorially and schematically showing a bottom plan view of the structure of the semiconductor chip of FIG. 5.

FIG. 10 is a diagram pictorially and schematically showing a bottom plan view of the structure of the semiconductor chip of FIG. 5.

Figure 11:
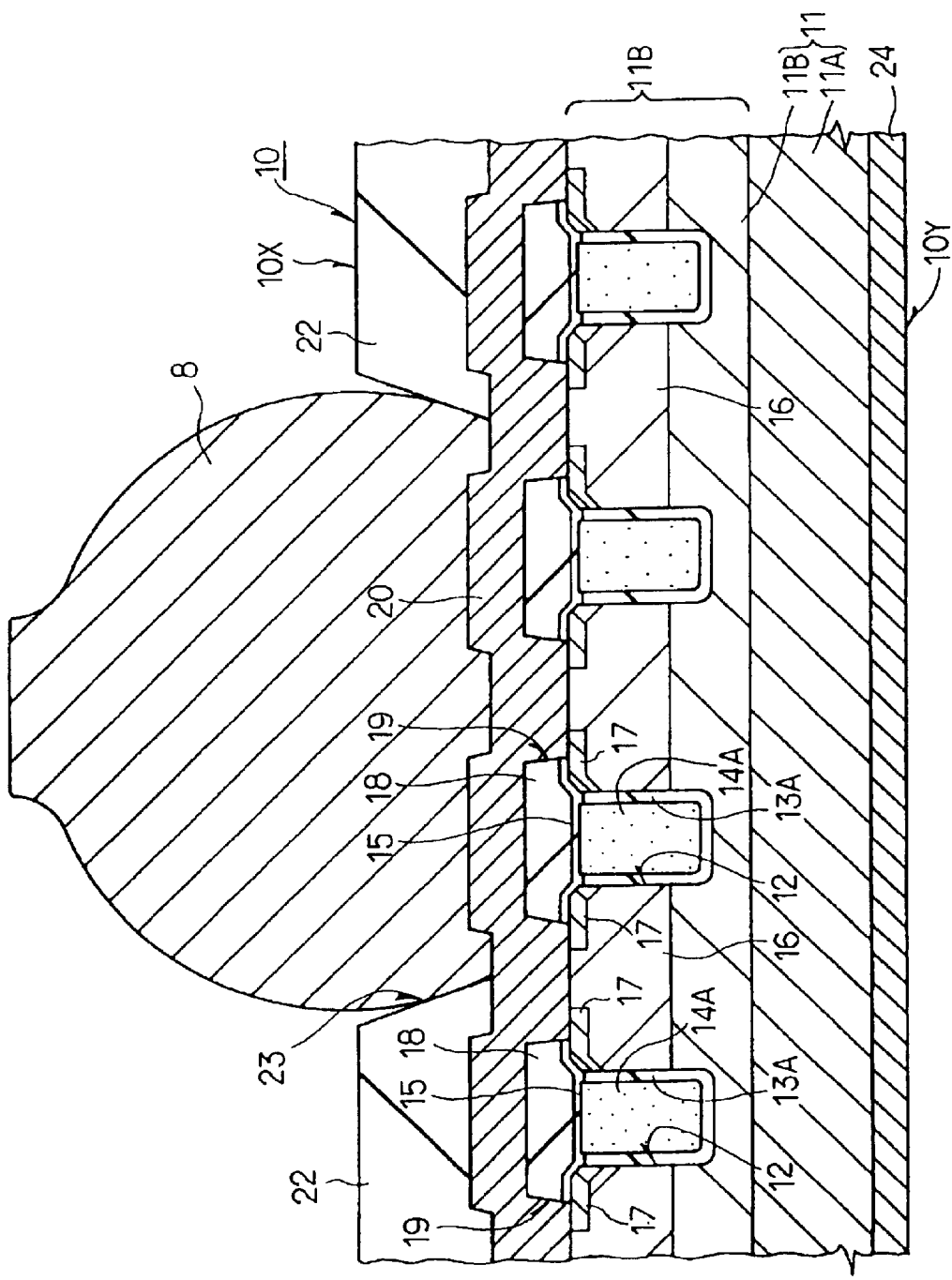
FIG. 11 is a pictorial representation of a sectional view of the structure of FIG. 9 as taken along line d—d.

FIG. 11 is a pictorial representation of a sectional view of the structure of FIG. 9 as taken along line d—d.

Figure 12:
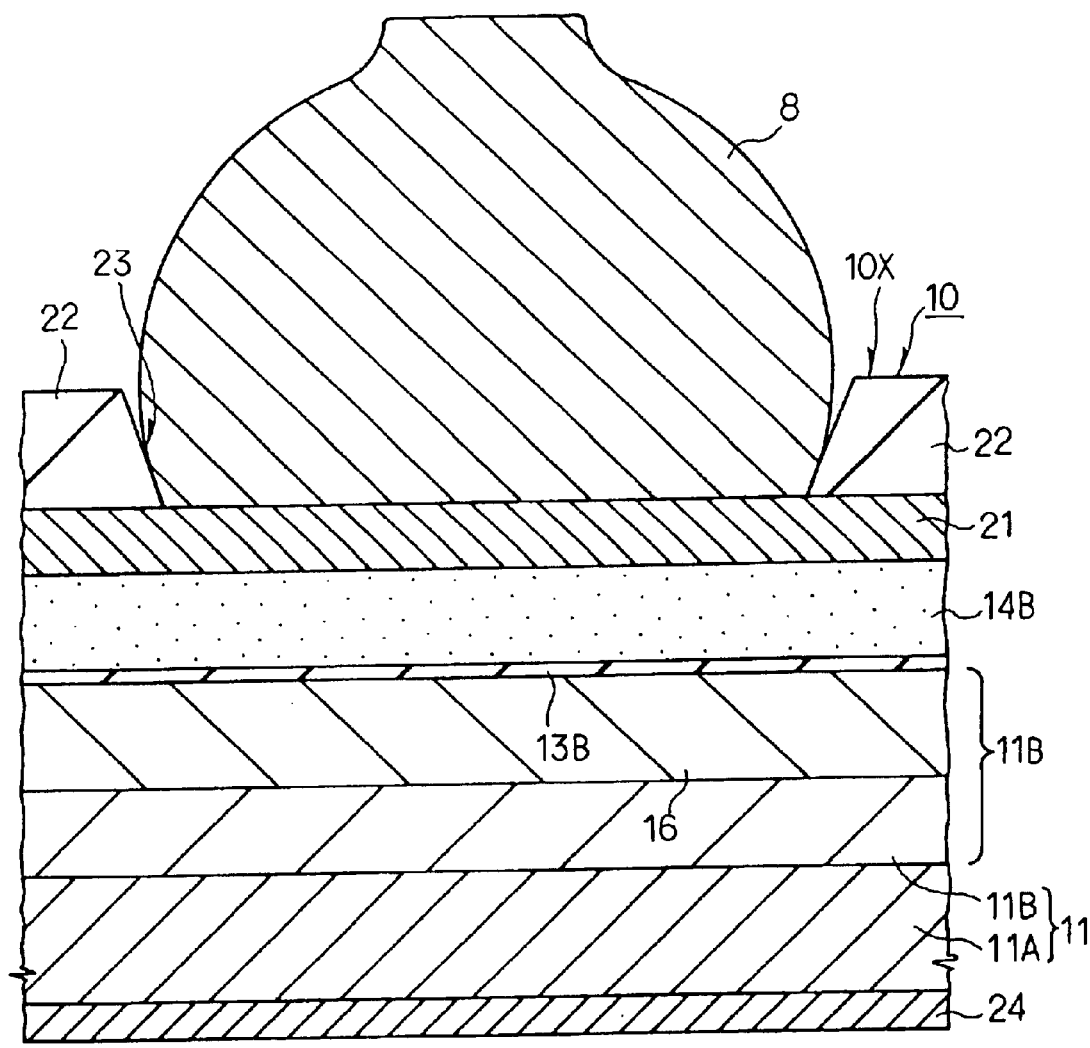
FIG. 12 is a pictorial representation of a sectional view of the structure of FIG. 9 taken along line e—e.

FIG. 12 is a pictorial representation of a sectional view of the structure of FIG. 9 taken along line e—e.

Figure 13:
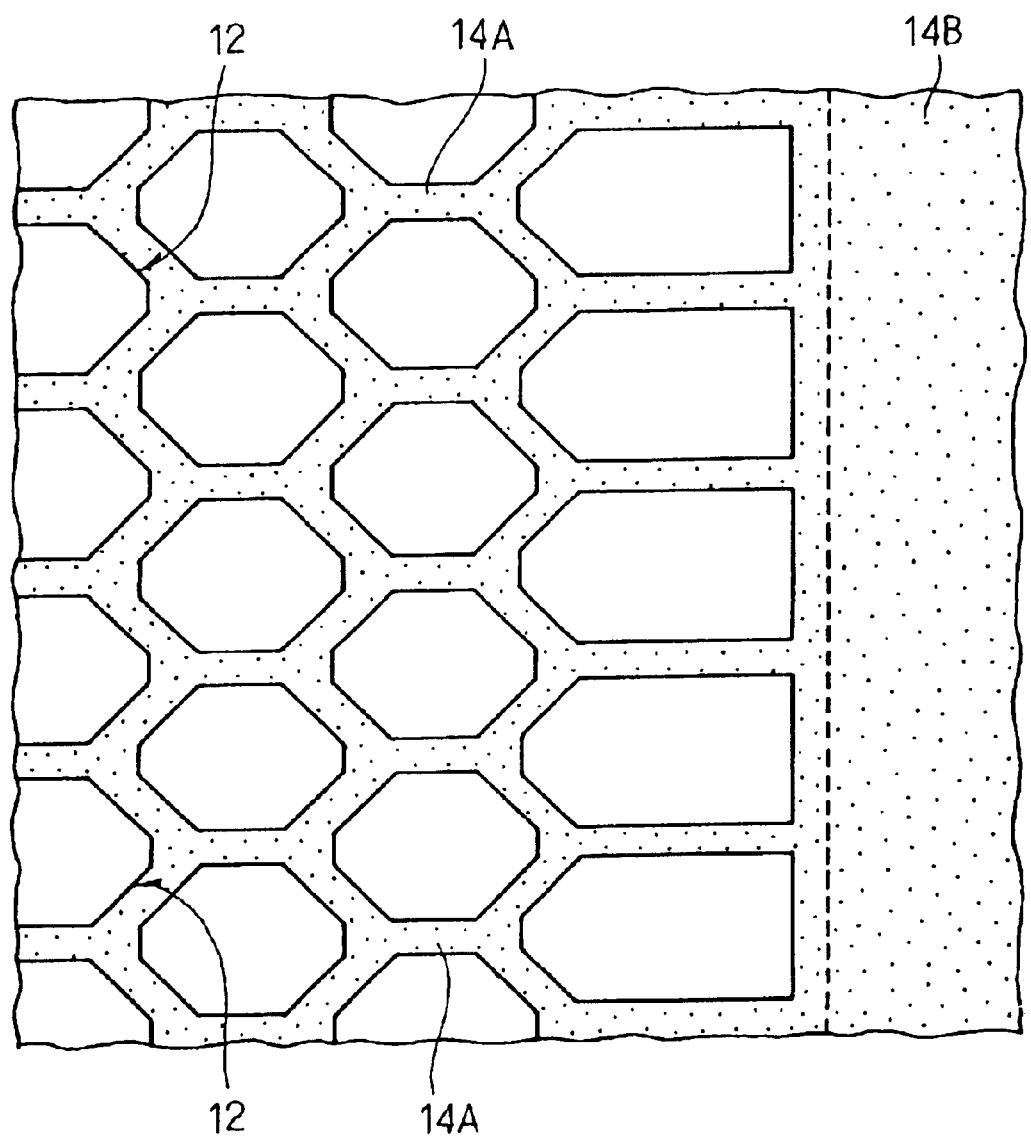
FIG. 13 is a pictorial representation of a planar pattern of a conductive gate layer of FIG. 11.

FIG. 13 is a pictorial representation of a planar pattern of a conductive gate layer of FIG. 11.

As shown in FIG. 1, a power module 50 embodying the present invention is generally constituted from a wiring substrate 40, a pair of power transistors 1A, 1B, a semiconductor device 30 for use as a controller, resistive elements R1–R2, and capacitive elements C1–C2. As shown in FIGS. 1–2 the wiring substrate 40 is arranged so that it has a plurality of conductive leads (41A to 41L) on a certain principal surface which is either one of a principal surface and a remaining principal surface that oppose each other.

As shown in FIGS. 5 through 8, the power transistor 1A is generally structured from a lead 2, a lead 3, a plurality of projected electrodes 8, an insulative or dielectric sheet 9, and a semiconductor chip 10.

As shown in FIGS. 6–7 the semiconductor chip 10 is arranged to have a source electrode 20 and gate electrode 21 on its element formation surface (first principal surface) 10X and also have a drain electrode 24 on a bottom surface (second principal surface) 10Y opposing the element formation surface 10X. The semiconductor chip 10 is formed to have a planar shape of a rectangle as shown in FIGS. 9 and 10 in the illustrative embodiment, the planar shape is an elongate rectangle of 3.9 [mm]×2.4 [mm] by way of example.

As shown in FIG. 11 the semiconductor chip 10 consists essentially of a semiconductive base body 11 which includes an $n^+$-type semiconductor substrate 11A made of single-crystalline silicon having its principal surface on which an $n^-$-type semiconductor layer 11B made of single-crystal silicon is formed. The principal surface of the semiconductive base body 11 includes an element formation region (active region) in which a transistor element is formed, such as for example an n-channel conductivity type MOSFET (Metal Oxide Semiconductor Field Effect Transistor) with the vertical type structure.

The MOSFET is structured mainly from a channel formation region, gate insulation film 13A, conductive gate layer 14A, source region, and drain region. The channel formation region is structured from a p-type well region 16 that is formed in the $n^-$-type semiconductor layer 11B. The source region is constituted from an $n^+$-type semiconductor region 17 as formed in the p-type well region 16. The drain region is formed of the $n^-$-type semiconductor layer 11B and $n^+$-type semiconductor substrate 11A. The gate insulation film 13A is formed along inner walls of grooves 12 which extend from the principal surface of the $n^-$-type semiconductor layer 11B in a depth direction, which film is formed for example of a silicon oxide film. The conductive gate layer 14A is buried or embedded within the grooves 12 via the gate insulation film 13A and is formed for example of a polycrystalline silicon or "polysilicon" film with a chosen impurity introduced thereinto for purposes of reducing the resistance value thereof. In brief, the MOSFET is of the so-called trench gate type. The trench gate type MOSFET is capable of shrinking an occupation area when compared to MOSFETs with a conductive gate layer formed over the principal surface of a semiconductive base body with a gate insulation film sandwiched therebetween and, for the very reason, is preferably adapted to miniaturize or "downsize" power transistors and also reduce turn-on resistivities thereof.

The element formation region on the principal surface of the n$^-$-type semiconductor layer 11B which is the principal surface of the semiconductive base body 11 is partitioned by the grooves 12 into a plurality of island-like regions. Respective ones of the plurality of island regions are regularly laid out into a matrix of rows and columns, wherein each island resembles in planar shape a compressed or oblate octagon. More specifically, as shown in FIG. 13, the conductive gate layer 14A is formed into a mesh pattern which surrounds the individual one of the plurality of island regions as partitioned by the grooves 12. Note that the n$^+$-type semiconductor region 17 for use as the source region is formed in principal surfaces of such island regions as partitioned by the grooves 12.

As shown in FIG. 11, each of the n$^+$-type semiconductor region 17 and p-type well region 16 is electrically connected to its overlying source electrode 20 through an opening 19 that is formed in an interlayer dielectric film 18. The interlayer dielectric film 18 is provided between the conductive gate layer 14A and source electrode 20 for electrical separation or isolation between the conductive gate layer 14A and source electrode 20. The source electrode 20 is formed of a metallic film such as for example either an aluminum (Al) film or aluminum alloy film. Additionally a dielectric film 15 is formed between the conductive gate layer 14A and interlayer dielectric film 18.

As shown in FIG. 12 and 13 the conductive gate layer 14A is integrally formed with a gate extension lead wire 14B that is formed over a peripheral region (non-active region) of the principal surface of n$^-$-type semiconductor layer 11B with a dielectric film 13B laid therebetween. Although not specifically depicted in the drawings, the gate extension lead 14B is electrically connected to the gate electrode 21 as formed thereover through an opening formed in the interlayer dielectric film 18. The gate electrode 21 is formed in the same layer as the source electrode 20 causing respective ones of the source electrode 20 and gate electrode 21 to be electrically isolated from each other.

As shown in FIG. 9 and 11–12, respective ones of the source electrode 20 and gate electrode 21 are covered or coated with a surface protection film 22 that is formed over these electrodes. The surface protective film 22 is such that a plurality of bonding openings 23 are formed therein thus permitting the plurality of projected electrodes 8 to be electrically and mechanically coupled to the source electrode 20 and gate electrode 21 via respective ones of the plurality of bonding openings 23. The surface protective film 22 is formed for example of a silicon oxide film. Gold (Au) bumps are employed as the projected electrodes 8 although the invention should not specifically be limited thereto. The Au bumps may be fabricated by ball bonding methods using Au wires with ultrasonic vibration used in combination with thermocompression bonding techniques. The Au bumps thus formed by ball bonding methods are rigidly coupled to electrodes of the semiconductor chip.

As shown in FIG. 9, the source electrode 20 and gate electrode 21 are each formed into a rectangular planar shape. In the illustrative embodiment the source electrode 20 is formed to have a rectangle of 3.1 [mm]×2.0 [mm] for example whereas the gate electrode 21 is formed into a rectangle of 0.4 [mm]×0.6 [mm]. On the other hand the drain electrode 24 is formed in an overall region of a back surface 10Y of the semiconductor chip 10 as shown in FIG. 10. As shown in FIG. 11 the drain electrode 24 is formed on the back surface that opposes the principal surface of the n$^+$-type semiconductor substrate 11A and is electrically connected to the n$^+$-type semiconductor substrate 11A. The drain electrode 24 is formed for example of an Au film.

As shown in FIGS. 5–6 the lead 2 is arranged to have a first portion 2A that is placed over the source electrode 20 of the semiconductor chip 10 and a second portion 2B which is integrally formed with this first portion 2A and is positioned outside of one long side 10a of two opposite long sides of the semiconductor chip 10.

The first portion 2A of the lead 2 is formed to have an area that is larger than an area of the source electrode 20 and is disposed to cover the source electrode 20. In the illustrative embodiment the first portion 2A of lead 2 is formed to have a size of about 3.2 [mm]×2.6 [mm] for example.

The first portion 2A of the lead 2 is electrically and mechanically coupled to the source electrode 20 of the semiconductor chip 10 with multiple projected electrodes 8 intervening therebetween and further is secured by adhesion to the element formation surface 10X of the semiconductor chip 10 with the insulative sheet 9 laid therebetween. More specifically the lead 2 is tightly held by the insulative sheet 9 and projected electrodes 8 on the element formation surface 10X of semiconductor chip 10.

As shown in FIGS. 5 and 7 the lead 3 is designed to have its own first portion 3A placed over the gate electrode 21 of the semiconductor chip 10 and a second portion 3B which is formed integrally with this first portion 3A and is placed outside of one long side 10a of the semiconductor chip 10.

The first portion 3A of the lead 3 is formed to have an area that is larger than an area of the gate electrode 21 and is disposed to cover the gate electrode 21. In the illustrative embodiment the first portion 3A of lead 3 is formed to have a size of about 0.5 [mm]×2.6 [mm] by way of example.

The first portion 3A of the lead 3 is electrically and mechanically coupled to the gate electrode 21 of the semiconductor chip 10 with a plurality of projected electrodes 8 intervening therebetween and further is secured by adhesion to the element formation surface 10X of the semiconductor chip 10 with the insulative sheet 9 laid therebetween. In other words the lead 3 is tightly held by the insulative sheet 9 and projected electrodes 8 on the element formation surface 10X of semiconductor chip 10.

Connection between the respective first portions (2A, 3A) of the lead 2 and lead 3 and the projected electrodes 8 being formed on or over respective electrodes (source electrode 20 and gate electrode 21) of the semiconductor chip 10 is done by thermocompression adhesion. The thermocompression-bonded projection electrodes 8 are designed so that each measures approximately 100 [μm] in width ϕ and about 50 [μm] in height 8h. Thickness values (2t, 3t) of the lead 2 and lead 3 are set at about 0.15 [mm] or more or less. A thickness lot of the semiconductor chip 10 is at about 0.3 [mm] as an example.

As shown in FIGS. 5 to 7 the respective second portions (2B, 3B) of the lead 2 and lead 3 are bent or folded so that respective distal ends (2B4, 3B4) are placed on the semiconductor chip 10's back surface 10Y side. In the illustrative embodiment the respective second portions (2B, 3B) of the lead 2 and lead 3 are each bent through machining processes to have a gull wing-like form, which is one of currently available surface-mount type lead shapes.

The distal ends (2B4, 3B4) of respective second portions (2B, 3B) of the lead 2 and lead 3 are disposed at substantially the same height as the back surface 10Y of the semiconductor chip 10 in a direction along the height 10S of the semiconductor chip 10.

The second portion 2B of the lead 2 thus bent into the gull-wing form is arranged to have a projecting portion (shoulder portion) 2B1 that projects from the first portion 2A of lead 2 toward the exterior of one long side 10a of the semiconductor chip 10 and an intermediate portion 2B2 folded and curved from this projecting portion 2B1 toward the semiconductor chip 10's back surface 10Y side plus a parts-mount portion (connection portion) 2B3 which extends from this intermediate portion 2B2 in the same direction as that of the projecting portion 2B1.

The second portion 3B of the lead 3 thus bent into the gull-wing form is arranged to have a projecting portion 3B1 that projects from the first portion 3A of lead 3 toward the exterior of one long side 10a of the semiconductor chip 10 and an intermediate portion 3B2 folded and bent from this projecting portion 3B1 toward the semiconductor chip 10's back surface 10Y side plus a parts-mount portion 3B3 that extends from this intermediate portion 3B2 in the same direction as that of the projecting portion 3B1.

The insulative sheet 9 is disposed between respective first portions (2A, 3A) of the lead 2 and lead 3 and the semiconductor chip 10 so that this sheet covers a selected area of the element formation surface 10X of the semiconductor chip 10 excluding a specified region in which the plurality of projected electrodes 8 are disposed. A resin sheet comprised for example of a thermally hardenable epoxy-based resin material containing thereon no conductive particles is employed as the insulative sheet 9 although the invention should not be limited thereto. The respective first portions (2A, 3A) of the lead 2 and lead 3 have upper faces (2AX, 3AX) that are exposed from the insulative sheet 9.

As shown in FIG. 5 the lead 2 is provided with slits 4A extending from the distal end 2B4 of the second portion 2B thereof toward the semiconductor chip 10. In the embodiment shown herein, two slits 4A are provided to extend from the distal end 2B4 of the second portion 2B up to the projecting portion 2B1.

As shown in FIGS. 5 and 8 the lead 2 has a width 2W which is greater than a width 3W of the lead 3 in order to achieve reduction of the turn-on resistance. In the illustrative embodiment the width 2W of the lead 2 is formed to measure approximately 3.2 [mm] whereas the width 3W of lead 3 is set at about 0.5 [mm] by way of example.

It should be noted that the first portion 2A of the lead 2 is slightly projected toward the exterior of one short side 10c of two opposite short sides of the semiconductor chip 10 and also the exterior of the other long side 10b thereof (see FIGS. 6 and 8). The first portion 3A of the lead 3 is projected by little toward the exterior of the other short side 10d of the semiconductor chip 10 and also the exterior of the other long side 10b thereof (see FIGS. 7 and 8). The dielectric sheet 9 is little projected toward the exterior of respective sides (10a, 10b, 10c, 10d) of the semiconductor chip 10.

The power transistor 1B is basically similar in structure to the power transistor 1A and is different therefrom in the following point. More specifically, while the power transistor 1A is arranged so that the second portions (2B, 3B) of the leads (2, 3) are disposed outside of one long side 10a of the semiconductor chip 10, the power transistor 1B is designed so that the second portions (2B, 3B) of such leads (2, 3) are disposed outside of the other long side 10b of semiconductor chip 10.

Incidentally, in surface-mount type packages, it should be required that a semiconductor chip used therein be protected from the ambient or outside environment while rigidly supporting leads thereon. With prior known package structures such as TSSOP type ones which are designed to attain protection of such semiconductor chip and holding of leads by use of machining of resin materials, it should be required to employ a resin flow passageway for use in letting such resin materials flow on the semiconductor chip's element formation surface side and its back surface side during resin machining processes using a metallic mold tool whereby the overall package structure might increase in resultant thickness by a degree that corresponds to the thickness of such resin passage.

In contrast, the power transistors (1A, 1B) embodying the instant invention are such that the semiconductor chip 10 is protected by the dielectric sheet 9 covering the element formation surface 10X thereof while letting the lead 2 and lead 3 be supported by such dielectric sheet 9 on the element formation surface 10X of semiconductor chip 10. As such protection of the semiconductor chip 10 and support of the leads (2, 3) owing to the dielectric sheet 9 are done by thermocompression adhesion with the insulative sheet 9 intervening between the element formation surface 10X of semiconductor chip 10 and the respective first portions (2A, 3A) of the lead 2 and lead 3 and also with the projected electrodes 8 intervening between the electrodes (source electrode 20, gate electrode 21) of the semiconductor chip 10 and the respective first portions (2A, 3A) of the lead 2 and lead 3, there is no longer required any resin flow passage as has been required in traditional packages for performing semiconductor chip protection and lead support by resin machining techniques. Accordingly, the overall package structure decreases in resultant thickness by a degree that corresponds to the thickness of such resin passage. In addition, since the intended electrical interconnection between the electrodes (source electrode 20, gate electrode 21) of semiconductor chip 10 and the respective first portions (2A, 3A) of the lead 2 and lead 3 is performed by using the projected electrodes, the resulting package decreases in thickness as a whole when compared to the case of conductive wires used.

With conventional package structures including TSSOP type ones as designed to employ a resin seal body to seal a semiconductor chip and inner lead portions of leads, these stay less in heat releasability for forcing heat generated at the semiconductor chip to escape to the exterior due to the fact that the semiconductor chip and the inner lead portions of such leads are covered with resin materials less in heat conductivity.

In contrast, the power transistors (1A, 1B) embodying the invention are high in heat releasability for forcing heat generated from the semiconductor chip to escape to the outside because of the fact that the side surfaces and back surface 10Y of the semiconductor chip 10 and the upper faces (2AX, 3AX) of the first portions (2A, 3A) of the leads (2, 3) plus the second portions (2B, 3B) of them are all exposed from the insulative sheet 9.

Those package structures such as the TSSOP type ones as designed to employ conductive wires for electrical connection between electrodes on the element formation surface of a semiconductor chip and associative leads are encountered with an unwanted increase in conductive current flow path between the semiconductor chip's electrodes and the leads associated therewith, which can result in creation of a serious bar to achievement of the intended turn-on resistance reduction in power transistors involved.

In contrast, the power transistors (1A, 1B) in accordance with the illustrative embodiment are such that electrical connection between the electrodes (source electrode 20, gate electrode 21) of the semiconductor chip 10 and the respective first portions (2A, 3A) of the lead 2 and lead 3 is done by the projected electrodes 8 so that the conductive path between the electrodes (source electrode 20, gate electrode 21) of semiconductor chip 10 and the leads (2, 3) becomes shorter. Thus, the power transistor 1A decreases in turn-on resistance.

As shown in FIG. 3, the semiconductor device 30 for use as a controller is formed of a device of the surface-mount type, called the TSOP (Thin Small Outline Package) type. The semiconductor control device 30 is arranged to comprise a semiconductor chip 33, a support body 31 that supports thereon the semiconductor chip 33, a plurality of leads 32, a plurality of conductive wires 34 for electrical connection between a plurality of electrodes as formed on a principal surface of the semiconductor chip 33 and respective inner portions of the plurality of leads 32, and a resin sealing body 35 for sealing these components. Mounted on the principal surface of the semiconductor chip 33 is a control circuit for controlling gate voltages of power transistors 1A, 1B. As in the power transistors 1A, 1B, the leads 32 and support body 31 measure 0.15 [mm] in thickness.

As shown in FIGS. 1 to 3 the plurality of leads 32 of the semiconductor control device 30 have parts-mount portions that are electrically and mechanically coupled by conductive adhesive material 42 to electrode pad portions each of which consists essentially of part of a corresponding one of the leads of the wiring substrate 40. The parts-mount portions (2B3, 3B3) of the leads (2, 3) of power transistors (1A, 1B) are electrically and mechanically coupled by conductive adhesive 42 to conductive pads that consist essentially of part of corresponding leads of the wiring substrate 40. In addition, the back surface 10Y of the semiconductor chip 10 of such power transistors (1A, 1B) is electrically and mechanically coupled by conductive adhesive 42 to electrode pads as formed of part of corresponding leads of the wiring substrate 40.

The power module 50 is received in a case along with its associative Li-ion secondary battery unit and is then built through assembly into a portable or mobile equipment by way of example. As shown in FIG. 4 the power module 50 thus built into the mobile equipment is electrically connected to the Li-ion secondary battery 43. Upon charge-up, it is electrically connected to an AC adapter 44. In the power module 50 the power transistors 1A, 1B are normally set in the ON state: when overcharged, the power transistor 1B is forced to turn off to thereby interrupt chargeup from the AC adapter 44; when overdischarged, let the power transistor 1A be OFF'ed thus stopping chargeup to the mobile equipment. The ON/OFF control of the power transistors 1A, 1B is performed by the semiconductor control device 30 that is operable to control respective gate voltages thereof.

In the power module 50 thus arranged, the power transistors 1A, 1B comprise:

the semiconductor chip 10 having the element formation surface 10X and back surface 10Y opposing each other, the source electrode 20 and gate electrode 21 as formed on the element formation surface 10X, and drain electrode 24 formed on the back surface 10Y;

the lead 2 having its first portion 2A placed over the source electrode 20, and second portion 2B formed integrally with the first portion 2A and placed outside of the semiconductor chip 10;

the lead 3 having its own first portion 3A placed over the gate electrode 21 and second portion 3B formed integrally with the first portion 3A and positioned outside of the semiconductor chip 10; multiple projected electrodes 8 disposed between the lead 2 and the source electrode and also between the lead 3 and gate electrode 21 for electrically connecting between respective ones; and the insulative sheet 9 disposed between the lead 2 and the element formation surface 10X of semiconductor chip 10 and between the lead 3 and the semiconductor chip 10, which sheet is designed to cover a selected area of the element formation surface 10X of semiconductor chip 10 other than specified regions in which the multiple projected electrodes 8 are laid out, wherein the respective second portions (2B, 3B) of the lead 2 and lead 3 are folded and bent so that respective distal ends (2B4, 3B4) thereof are disposed at substantially the same height as that of the back surface 10Y of the semiconductor chip 10, and each of the distal ends of the respective second portions of the lead 2 and lead 3 and respective drain electrodes 24 is connected to a corresponding one of the electrodes of the wiring substrate 40.

With such an arrangement, the semiconductor chip 10's side surfaces and back surface 11Y and the upper faces (2X, 3AX) of the first portions (2A, 3A) of the leads (2, 3) plus the entire second portions (2B, 3B) thereof are exposed out of the insulative sheet 9 so that the heat releasability for permitting heat generated from the semiconductor chip 10 toward the exterior is made higher. Accordingly, even where the wiring substrate 40 decreases in area with a decrease in size of the power module 50, it becomes possible to retain the intended heat releasability of the power module 50 to thereby accomplish downsizing or miniaturization of the power module 50.

Figure 14:
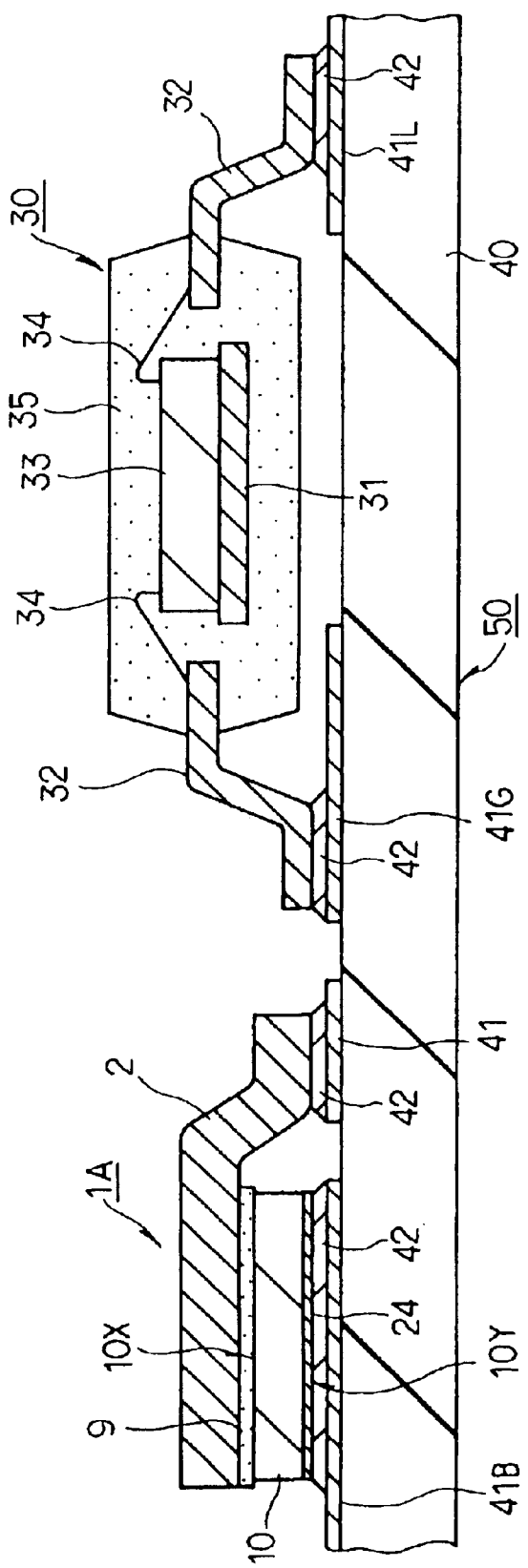
FIG. 14 is a diagram pictorially showing in cross-section main part of a power module in accordance with a modified example of the embodiment of the invention.

In addition, since it is no longer necessary to employ any resin flow passage which has been required for prior known packages that are designed to make use of resin machining schemes to attain semiconductor chip protection and lead support, the package decreases in thickness as a whole by a degree corresponding to the thickness of such resin flow passage. Thus, as shown in FIG. 14 (the diagram pictorially showing in cross-section main part of the power module in accordance with one possible modified example of the embodiment of the present invention), it is possible to make the thicknesses of the leads 2, 3 greater than the thickness of leads 32 of the semiconductor control device 30 by the degree equal to an expected decrease in thickness of the entire package (for example, the thicknesses of leads 2, 3 measure 0.3 [mm] or more or less), which in turn makes it possible to reduce the turn-on resistances of the power transistors 1A, 1B while at the same time improving the heat releasability thereof.

Additionally, as electrical connection between the electrodes (source electrode 20, gate electrode 21) of the semiconductor chip 10 and the respective first portions (2A, 3A) of the leads 2 and 3 is done by using the projected electrodes 8, the resultant conductive path between the semiconductor chip 10's electrodes (source electrode 20, gate electrode 21) and the leads (2, 3) becomes shorter. Thus, the power transistors 1A, 1B decrease in turn-on resistance.

Note here that although the illustrative embodiment has been discussed in regard to the specific power transistors 1A, 1B having the semiconductor chip 10 with the source electrode 20 and gate electrode 21 formed on the element formation surface 10X and with the drain electrode 24 formed on the back surface 10Y, the same results are also expectable when employing those power transistors having a semiconductor chip with the drain electrode and gate electrode formed on the element formation surface and with the source electrode formed on the back surface.

Also note that although the above embodiment was set forth in a way relating to one specific example using the semiconductor control device 30 formed of the TSOP type one, there is also employable a semiconductor control device arranged in a way similar to the power transistors 1A, 1B. In this case the semiconductor control device also decreases in thickness in a way similar to the power transistors 1A, 1B, which in turn makes it possible to likewise miniaturize or downsize the power module.

Although the invention made by the present inventors has been concretely explained based on said embodiment, it would be readily appreciated that this invention should not be limited only to said embodiment and may be modified and altered into a variety of different forms without departing from the true spirit and scope of the invention.

An advantage obtainable by a representative one of the inventive teachings as disclosed herein will be explained in brief below.

It is possible to achieve miniaturization or downsizing of the electronic device.

INDUSTRIAL APPLICABILITY

It has been stated herein that the electronic device in accordance with the present invention is beneficially applicable to electronic devices having power transistors and also beneficially adaptable for use in small size electronic equipment including but not limited to portable telephone handsets and handheld information processing terminal equipment plus mobile personal computers or else employing such electronic devices having the power transistors.

What is claimed is:

1. An electronic device having a wiring substrate with a plurality of electrodes on a principal surface thereof and also having a first semiconductor device and a second semiconductor device both being mounted on the principal surface of said wiring substrate, wherein
    said first semiconductor device comprises:
        a semiconductor chip having first and second principal surfaces opposing each other, first and second electrodes formed on the first principal surface, and a third electrode formed on the second principal surface;
        a first lead having a first portion placed over said first electrode and a second portion being formed integrally with said first portion and placed outside of said semiconductor chip;
        a second lead having a first portion placed over said second electrode and a second portion as formed integrally with said first portion and placed outside of said semiconductor chip;
        a plurality of projected electrodes disposed between said first lead and said first electrode and also between said second lead and said second electrode for electrical connection of respective ones of them; and
        an insulative sheet disposed between said first lead and the first principal surface of said semiconductor chip and between said second lead and said semiconductor chip for covering a certain part of the first principal surface of said semiconductor chip other than a region with said plurality of projected electrodes disposed therein,
    wherein a respective one of the second portions of said first lead and said second lead is folded to have a distal end disposed at substantially the same height as the second principal surface of said semiconductor chip in a thickness direction of said semiconductor chip, and
    each of said third electrode and the distal ends of the second portions of said first lead and second lead is connected to a corresponding electrode of said wiring substrate.

2. The electronic device as recited in claim 1, wherein said first electrode is a source electrode, said second electrode is a gate electrode, and said third electrode is a drain electrode.

3. The electronic device as recited in claim 1, wherein said first electrode is a drain electrode, said second electrode is a gate electrode, and said third electrode is a source electrode.

4. The electronic device as recited in claim 1, wherein said first semiconductor device is less in thickness than said second semiconductor device.

5. The electronic device as recited in claim 4, wherein the first and second leads of said first semiconductor device are greater in thickness than a lead of said second semiconductor device.

6. An electronic device having a wiring substrate with a plurality of electrodes on a principal surface thereof and also having a first semiconductor device and a second semiconductor device both being mounted on the principal surface of said wiring substrate, wherein
    said first semiconductor device comprises:
        a first semiconductor chip having first and second principal surfaces opposing each other, first and second electrodes formed on the first principal surface, and a third electrode formed on the second principal surface;
        a first lead having a first portion placed over said first electrode and a second portion being formed integrally with said first portion and placed outside of said first semiconductor chip;
        a second lead having a first portion placed over said second electrode and a second portion as formed integrally with said first portion and placed outside of said first semiconductor chip;
        a plurality of projected electrodes disposed between said first lead and said first electrode and also between said second lead and said second electrode for electrical connection of respective ones of them; and
        an insulative sheet disposed between said first lead and the first principal surface of said first semiconductor chip and between said second lead and said first semiconductor chip for covering a certain part of the first principal surface of said first semiconductor chip other than a region with said plurality of projected electrodes disposed therein,
    said second semiconductor device comprises:
        a second semiconductor chip having first and second principal surfaces opposing each other, a plurality of third electrodes formed on said first principal surface;

a plurality of third leads disposed to surround said second semiconductor chip;

a plurality of bonding wires connecting said plurality of third electrodes of said second semiconductor chip with one ends of said plurality of third leads; and a resin body sealing said second semiconductor chip, said plurality of bonding wires and portions of said plurality of third leads, the other ends of said plurality of third leads protruding outwardly from a side surface of said resin body and bending to said principal surface of said wiring substrate;

wherein a respective one of the second portions of said first lead and said second lead is folded to have a distal end disposed at substantially the same height as the second principal surface of said first semiconductor chip in a thickness direction of said first semiconductor chip, and each of said third electrode and the distal ends of the second portions of said first lead and second lead is connected to a corresponding electrode of said wiring substrate, wherein an upper surface of said first and second leads of said first semiconductor device is positioned under an upper surface of said resin body of said second semiconductor device in a thickness direction of said wiring substrate.

7. The electronic device as recited in claim 6, wherein said first electrode is a source electrode, said second electrode is a gate electrode, and said third electrode is a drain electrode.

8. The electronic device as recited in claim 6, wherein said first electrode is a drain electrode, said second electrode is a gate electrode, and said third electrode is a source electrode.

9. The electronic device as recited in claim 6, wherein said first semiconductor device is less in thickness than said second semiconductor device.

10. The electronic device as recited in claim 9, wherein the first and second leads of said first semiconductor device are greater in thickness than a lead of said second semiconductor device.

11. The electronic device as recited in claim 6, wherein said first semiconductor device is a power transistor, and said second semiconductor device controls a gate voltage of the first semiconductor device.

\* \* \* \* \*